(12) United States Patent
Ma et al.

(10) Patent No.: US 6,570,468 B2
(45) Date of Patent: May 27, 2003

(54) RESONATOR FREQUENCY CORRECTION BY MODIFYING SUPPORT STRUCTURES

(75) Inventors: Qing Ma, San Jose, CA (US); Peng Cheng, Campbell, CA (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/895,360

(22) Filed: Jun. 29, 2001

(65) Prior Publication Data

US 2003/0001694 A1 Jan. 2, 2003

(51) Int. Cl.⁷ .............................. H03H 9/05; H03H 9/24; H03H 9/46; H03H 3/013
(52) U.S. Cl. .......................... 333/188; 333/200; 73/579
(58) Field of Search ................................. 333/186–192, 333/200; 310/312; 73/579

(56) References Cited

U.S. PATENT DOCUMENTS

| | | | | |
|---|---|---|---|---|
| 5,144,184 A | * | 9/1992 | Greiff | 310/312 |
| 5,469,010 A | * | 11/1995 | Kawashima | 310/312 |
| 5,587,620 A | * | 12/1996 | Ruby et al. | 310/346 |
| 5,640,133 A | * | 6/1997 | MacDonald et al. | 333/197 |
| 5,729,075 A | * | 3/1998 | Strain | 310/309 |
| 6,051,907 A | * | 4/2000 | Ylilammi | 310/312 |
| 6,107,721 A | * | 8/2000 | Lakin | 310/321 |

FOREIGN PATENT DOCUMENTS

| JP | 8-32396 | * | 2/1996 |
|---|---|---|---|
| WO | WO 98/57423 | * | 12/1998 |

OTHER PUBLICATIONS

"Micromachining technologies for miniaturized communication devices", Clark T.–C Nguyen, Proceedings of SPIE: Micromachining and Microfabrication, Santa Clara, California, Sep. 20–22. 1998, pp. 24–38.

* cited by examiner

Primary Examiner—Robert Pascal
Assistant Examiner—Barbara Summons
(74) Attorney, Agent, or Firm—Blakely, Sokoloff, Taylor & Zafman LLP

(57) ABSTRACT

A method including to a resonator coupled to at least one support structure on a substrate, the resonator having a resonating frequency in response to a frequency stimulus, modifying the resonating frequency by modifying the at least one support structure. A method including forming a resonator coupled to at least one support structure on a chip-level substrate, the resonator having a resonating frequency; and modifying the resonating frequency of the resonator by modifying the at least one support structure. A method including applying a frequency stimulus to a resonator coupled to at least one support structure on a chip-level substrate determining a resonating frequency; and modifying the resonating frequency of the resonator by modifying the at least one support structure. An apparatus including a resonator coupled to at least one support structure on a chip-level substrate, the resonator having a resonating frequency tuned by the modification of the at least one support structure to a selected frequency stimulus.

16 Claims, 6 Drawing Sheets

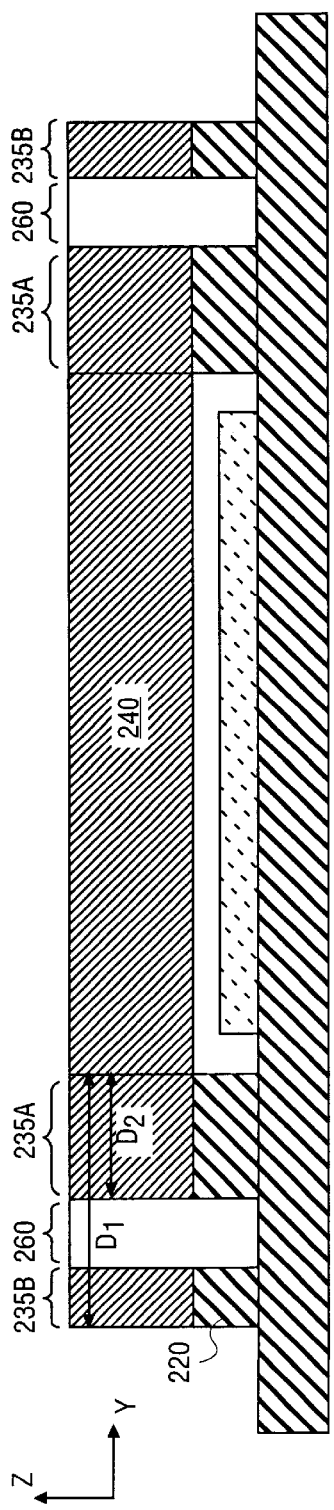
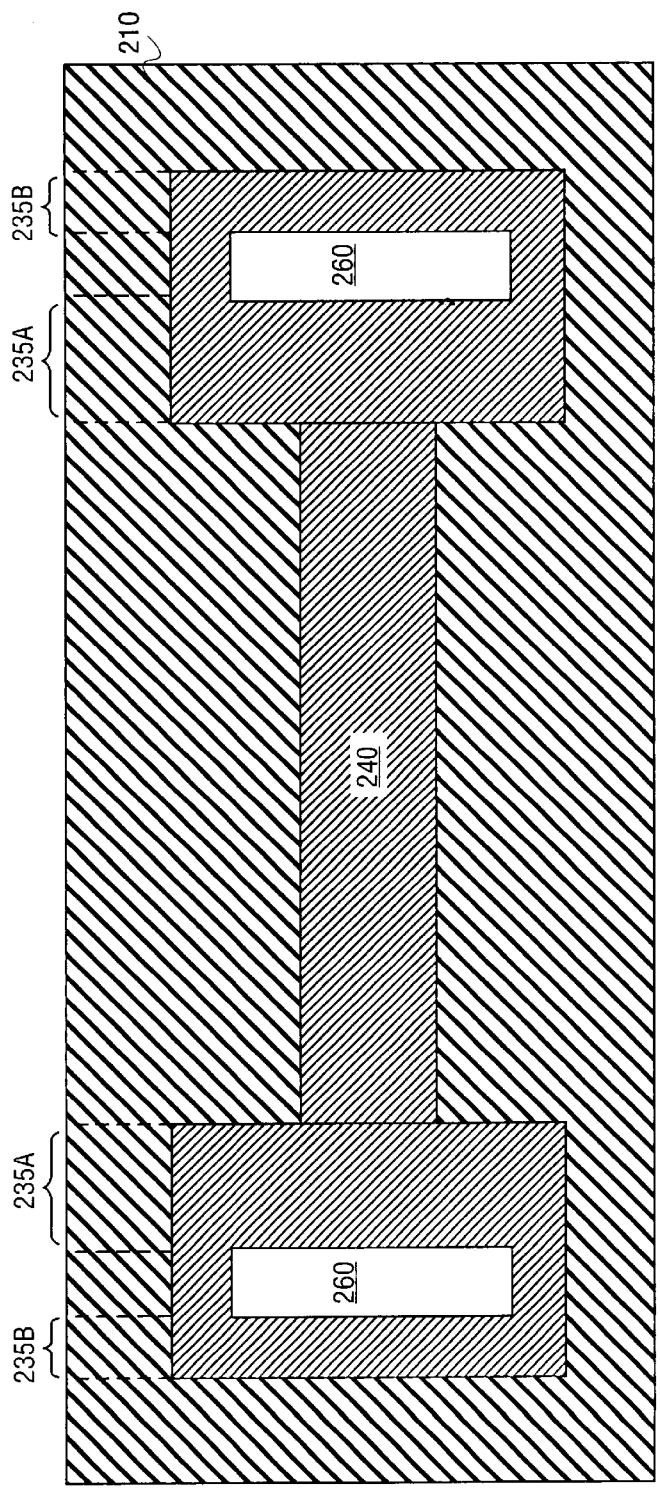
FIG. 4
FIG. 5

RESONATOR FREQUENCY CORRECTION BY MODIFYING SUPPORT STRUCTURES

BACKGROUND

1. Field of the Invention

The invention relates to microelectromechanical structures (MEMS).

2. Background

Communication systems generally require partitioning of the electromagnetic frequency spectrum. Communication transceiver devices therefore must be capable of high frequency selectivity, i.e., capable of selecting a given frequency band while rejecting all others. Frequency-selective devices, such as filters, oscillators and mixers are therefore some of the most important components within a transceiver and the quality of the devices generally dictates the overall architecture of a given transceiver.

In wireless radio frequency (RF) devices, resonators are generally used for signal filtering and generation purposes. The current state of the art typically is the use of discrete crystals to make the resonators (off-chip resonators). To miniaturize devices, MEMS resonators have been contemplated.

In a typical resonator, the resonance frequency after processing is usually different from the targeted value due to processing variation. For discrete crystals as mentioned above, such resonance frequency error is usually corrected using laser trimming technology. However, because MEMS resonators (particularly high frequency MEMS resonators) are generally much smaller in size than their crystal counterparts, traditional laser trimming technology is not a viable alternative. One alternative is to remove or add mass to the resonator beam to increase or decrease frequency. However, as beam structures are targeted to micron or submicron sizes as required for ultra-high frequency, it is generally impractical to directly modify the beam. Such modification to the beam thickness tends to be inaccurate. The inaccuracy is believed to be principally due to the sensitivity of the spring constant (k) dependency of the beam thickness. Accordingly, what is needed are techniques to modify the resonance frequency of a resonator.

BRIEF DESCRIPTION OF THE DRAWINGS

The features, aspects, and advantages of the invention will become more thoroughly apparent from the following detailed description, appended claims, and accompanying drawings in which:

FIG. 4 shows the resonator of FIG. 2 following modification of the support structure.

FIG. 5 shows a top view of the structure of FIG. 4.

DETAILED DESCRIPTION

In one embodiment, a method of modifying the frequency of a resonator is described. Such modification may be suitable, in one example, in MEMS-fabricated resonators wherein a MEMS-fabricated resonator has a frequency that may be a frequency other than the targeted value due to processing variations in the fabrication of the resonator. To achieve the targeted frequency value, a method of modifying the resonator by modifying the support structure is described. An apparatus, such as a resonator, having a frequency determined by the modification of the support structure is also described.

Figure 1:
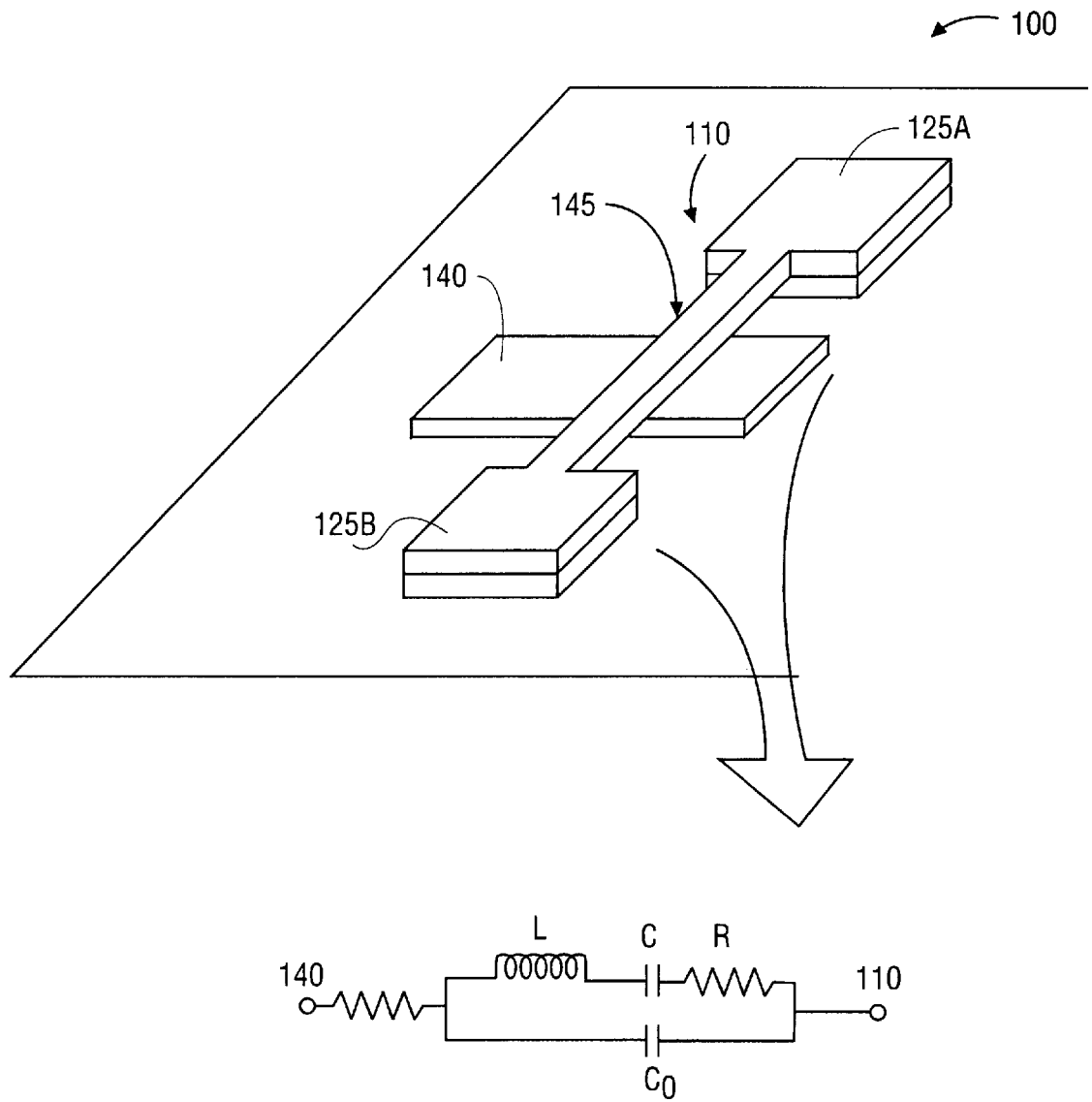
FIG. 1 shows a top perspective schematic view of one example of an "on chip" resonator.

FIG. 1 schematically illustrates a chip-based resonator structure that may be used, for example, in a bandpass micromechanical filter. Referring to FIG. 1, structure 100 includes bridge micromechanical resonator 110. Resonator 110 is coupled at anchors 125A and 125B but is otherwise free-standing. The vibration of the resonator is induced by a lateral gap capacitive transducer (a frequency stimulus). The capacitive transducer is formed by disposing electrode 140 adjacent resonator 110 with, in this case, gap 145 between electrode 140 and resonator 110.

Structure 100 is essentially a two-terminal device having a typical equivalent electrical circuit as shown operates in the following representative manner. The circuit has two terminals corresponding to electrode 140 and beam 110, respectively, between which the impedance is very high at all frequencies other than the resonance frequency. At the resonance frequency, the resistance between the terminals becomes very low. In the example of use in a filter, an input signal may be passed at the resonance frequency.

It is appreciated that one desired performance of a resonator structure (such as resonator structure 100) is the ability to limit the resonating frequencies for which the resonator will vibrate and produce a mechanical signal. In the case of an oscillator serving, for example, as part of a clock circuit, it is important that the resonator-based oscillator vibrate at a target clock frequency. In the case of a filter, it may be desirable for a resonator to resonate at target frequencies and pass an input signal, while not vibrating at other frequencies and thus rejecting other input signal.

At higher frequencies (e.g., ultra-high frequencies) targeted vibrating frequencies become harder to achieve during fabrication. Continued miniaturization and limits on fabrication technology (e.g., photolithography) performance contribute to the increased error between the targeted frequency and the actual frequency following fabrication.

Figure 2:
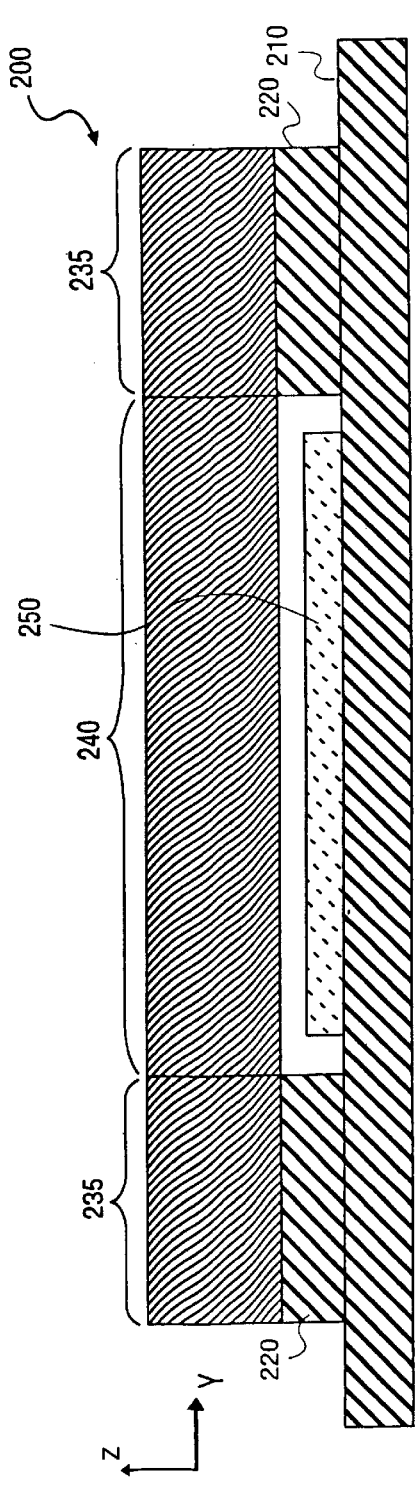
FIG. 2 shows a schematic, cross-sectional side view of one embodiment of a MEMS fabricated resonator.
Figure 3:
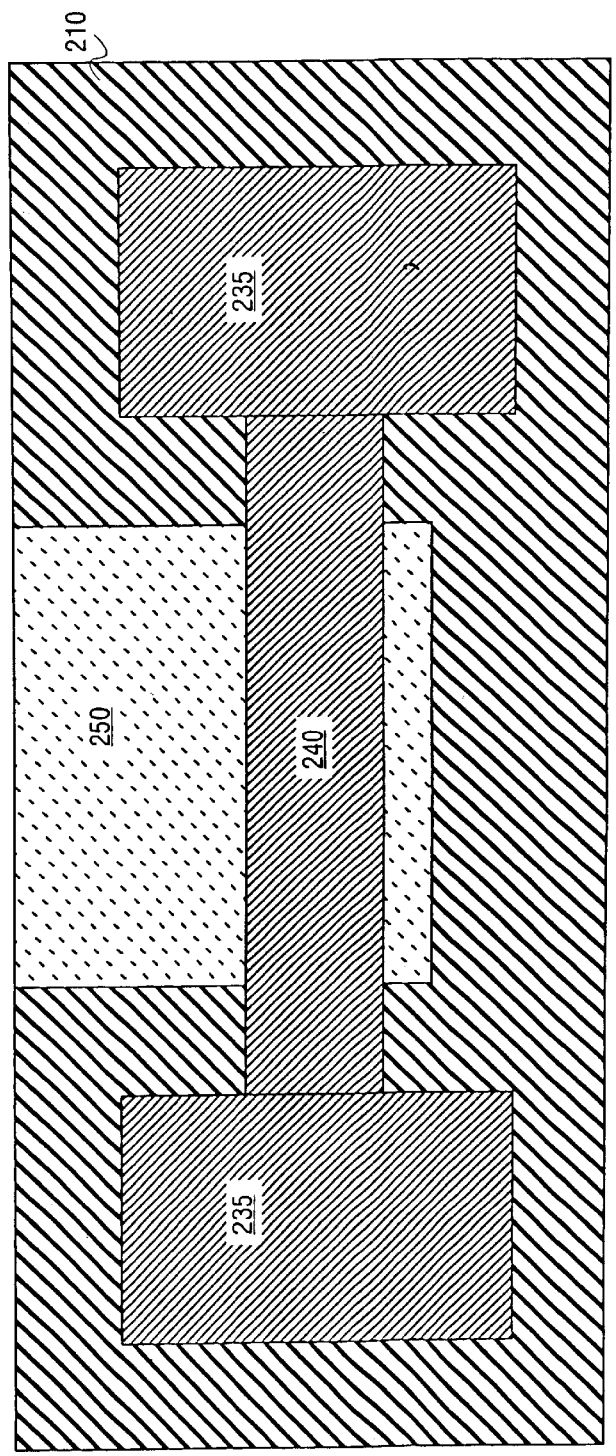
FIG. 3 shows a top view of the resonator of FIG. 1.

FIG. 2 and FIG. 3 show a schematic, cross-sectional side view of a micro-bridge resonator, such as a resonator used in the assembly shown in FIG. 1. FIG. 2 shows micro-bridge resonator structure 200. Micro-bridge resonator structure 200 is formed on a portion of substrate 210. Substrate 210 is, for example, a semiconductor (e.g., silicon) substrate suitable as a base structure for MEMS applications. It is appreciated that other substrates, such as glass (including silicon on insulator) and ceramic substrates may be suitable. Substrate 210 may have contact points (pads, terminals) disposed on its surface to which device structures (e.g., electrodes) may be formed. Conductive traces may also be disposed throughout the body of substrate 210 to connect contact points on the substrate to one another or to another substrate. Substrate 210 may further have one or more device levels, including interconnect levels, formed thereon.

In one embodiment, micro-bridge resonator structure 200 is formed by a series of deposition and etch patterning. Micro-bridge resonator structure 200 includes, for example, a polycrystalline silicon bridge shown, in this view, to comprise support structures 235 overlying anchor portions 220 and beam 240 disposed above electrode 250. Beam 240 is, in one sense, supported between support structure 235 but is otherwise free-standing. In this embodiment, z-direction thickness of anchor portions 220 of, for example, silicon dioxide ($SiO_2$), separate beam 240 from substrate 210. Electrode 250 is illustrated adjacent beam 240.

It is appreciated that, once formed, micro-bridge resonator structure 200 will have a certain resonating frequency that primarily owing to the limitations of the processing environment, may or may not be the targeted frequency for the particular application (e.g., filter, oscillator, etc.). Thus, in certain instances, it is desirable to modify the resonating frequency of microbridge resonator structure 200. In general, the resonance frequency depends on the length and thickness of beam 240. It has also been determined that the resonance frequency may be influenced by the compliance of the supporting structure.

FIG. 4 and FIG. 5 show a cross-sectional side view and a top view, respectively, of micro-bridge resonator structure 200 following modification of support structures 235 to influence (modify) the resonance frequency of the structure. In this example, notches 260 are introduced in support structures 235. In one example, notches 260 are formed by lithographic techniques, e.g., patterning a masking material over micro-bridge resonator structure 200 and etching notches 260 into support structures 235. In terms of etching, any suitable etchant to etch, in this case, polycrystalline silicon and the material for anchor portion 220 is suitable. Alternatively, and particularly for reduced feature size device structures where point control is desired, notches 260 may be introduced using a focused ion beam (FIB) or laser etching process. In either case, control of the beam center position can be as good a few nanometers (nm). Referring to FIG. 4, in this example, notches 260 extend completely through support structures 235 and anchor portion 220.

It has been found that etching a notch in the support structures of a micro-bridge resonator generally increases the compliance of the support structure. An increase in compliance (flexibility) generally decreases the resonance frequency of a resonator structure. Compliance is influenced by the effective pad size of the support structures. In FIG. 4, support structures 235 have an effective pad size defined by the parameter D (e.g., y-direction length). Prior to introducing notches 260, the pad size is defined by the parameter $D_1$. After introducing notches 260, the pad size is defined by the smaller parameter $D_2$ ($D_2 < D_1$). The determination of pad size is defined by parameter $D_2$ and support structure portion 235A while, in this example, support structure portion 235B is mechanically irrelevant.

Figure 6:
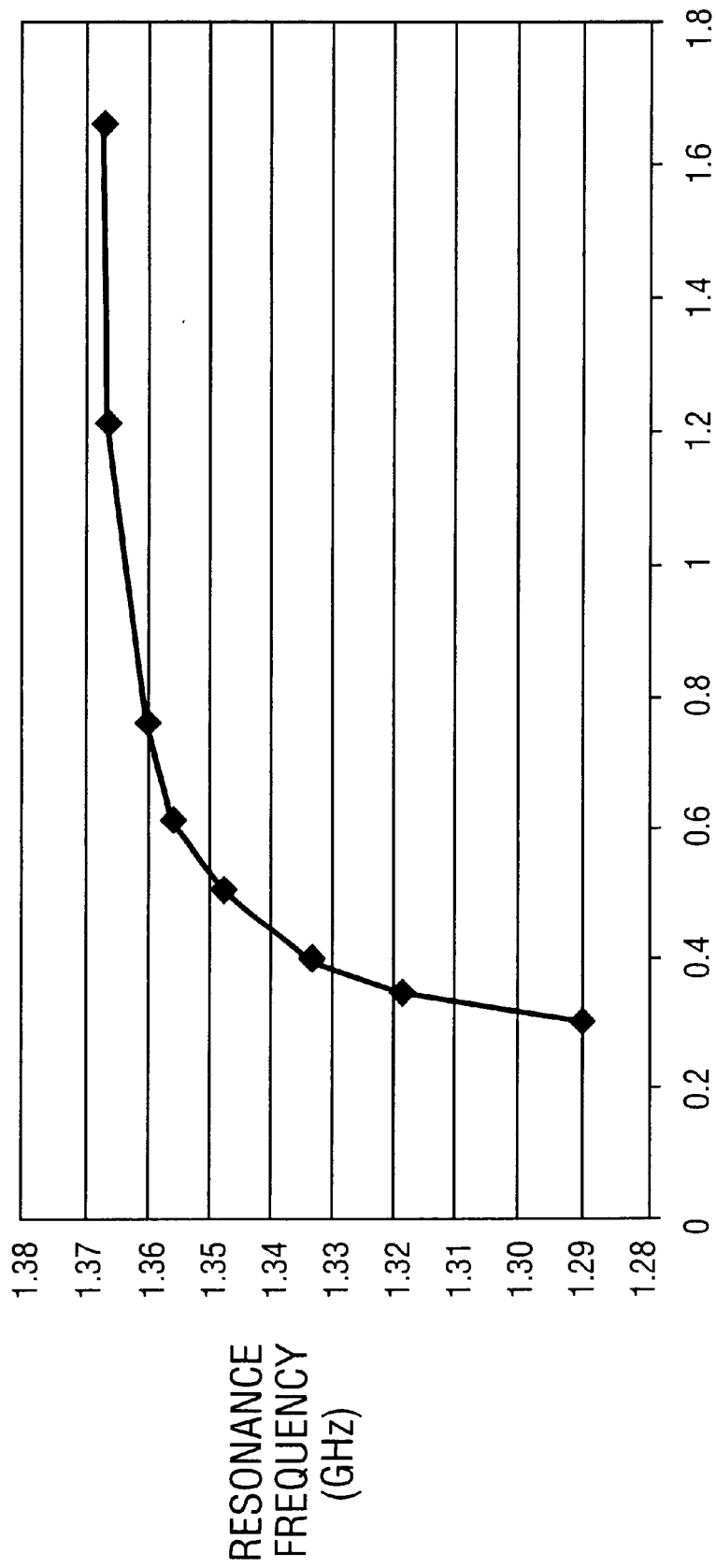
FIG. 6 graphically represents the effect of support pad size and the resonance frequency.

FIG. 6 shows the effect of support pad size on the resonance frequency. The calculation is performed for a resonator beam of 0.25 microns ($\mu m$) thickness and one micron in length by 1 micron in width. As illustrated in FIG. 6, as support pad size decreases, for example, from $D_1$ to $D_2$, the resonance frequency decreases.

As illustrated in the above embodiment, a modification to the support structure of a micro-bridge resonator structure can influence the resonance frequency of the resonator. Thus, in the situation where a MEMS-fabricated resonator does not meet the targeted resonance frequency following processing (e.g., deposition, patterning), the resonance frequency may be modified by modifying the support structures. Thus, a targeted value of resonance frequency is attainable by evaluating the resonance frequency of a resonator and modifying the support structures, where necessary, to achieve a desired resonance frequency.

Figure 7:
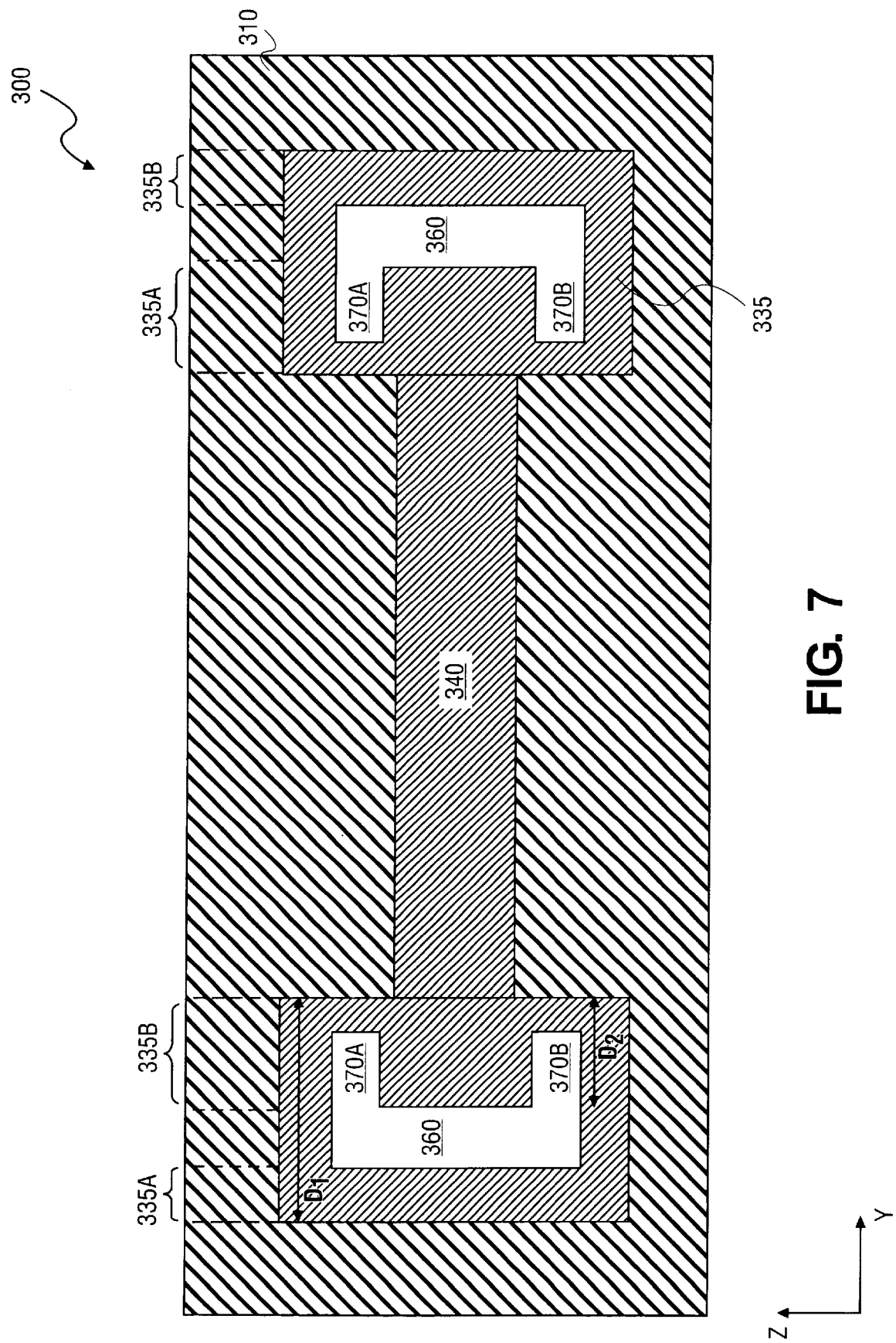
FIG. 7 shows a schematic, top view of a second embodiment of MEMS-fabricated resonator.

FIG. 7 shows a second embodiment of a micro-bridge resonator structure modified to meet a targeted resonance frequency. Micro-bridge resonator structure 300 includes support structures 335 supporting resonator beam 340 over a portion of substrate 310. In this view, notches are introduced in support structures 335 about two different axes. It has been found that introducing (forming) a notch in the z-direction (e.g., orthogonal to the resonator beam length) is generally more sensitive to resonance frequency modification than a notch in the y-direction. Thus, notches 360 may be introduced (formed) in support structures 335 in a z-direction as a "coarse" correction. Such notches 360 may be formed as described above with respect to FIGS. 4 and 5 and the accompanying text. Notches 360 may be formed through a portion, including the entire portion of support structures 335 with the compliance of beam 340 generally increasing with the depth of the notch. Where notches 360 extend through the entire portion of support structures 335, notches 360 and support structures 335 define support structure portions 335A and 335B with the pad size defined by parameter $D_2$ similar to that described above with respect to FIGS. 4 and 5 and the accompanying text. The coarse modification (correction) may be used, for example, to bring the resonance frequency within a few one-hundredths of the targeted frequency. Thus, having formed notches 360, the resonance frequency may be evaluated for accuracy with the targeted resonance frequency.

To further modify the resonance frequency in a generally minor fashion (e.g., "fine" tuning) additional notches may be introduced in support structures 335 in a different direction, such as in this case, the y-direction. Referring to FIG. 7, notches 370A and 370B are formed in a y-direction in support structures 335. In this illustration, two notches 370A and 370B are formed in each support structures. It is appreciated that the number and location of notches will vary depending on the level of tuning. For example, a single y-direction (or other direction) notch may be introduced in each support structures 335 and this can be followed by an evaluation of the frequency of resonator structure 300. If further tuning is necessary, additional (one or more) y-direction (or other direction) notches may be introduced as necessary.

Figure 8:
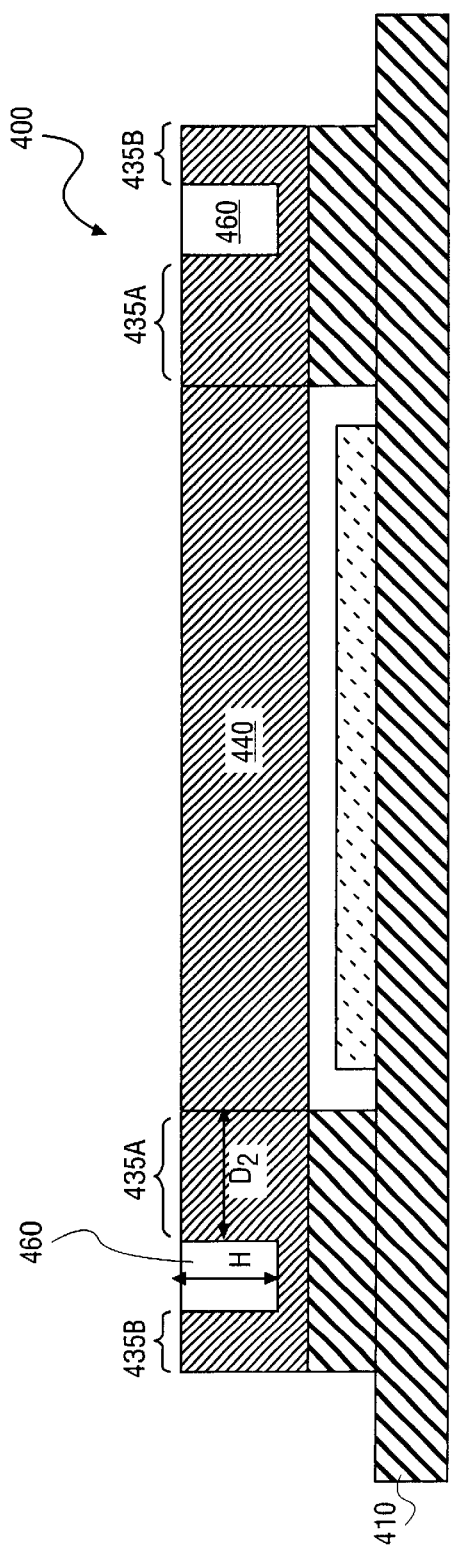
FIG. 8 shows a schematic, cross-sectional view of a third embodiment of a modified MEMS-fabricated resonator.

FIG. 8 shows a third embodiment of a micro-bridge resonator structure modified to meet a targeted resonance frequency. Micro-bridge resonator structure 400 includes support structure 435 supporting resonator beam 440 over a portion of substrate 410. In this view, notches 460 are introduced in support structures 435 in a z-direction through less than the entire portion of the support structure. As noted above, it is appreciated that notches may be formed (for example, by ion beam or laser cutting technique) through a portion, including the entire portion, of support structures 435 with the compliance of beam 440 generally increasing with the depth of the notch. In FIG. 8, notches 460 are introduced into support structures 435 to a depth, H. The notches 460 modify the pad size of support structures 435 by forming portions 435A and 435B. It is appreciated that, where the notches do not proceed through the entire portion of support structures 435, support structure portion 435B remains mechanically relevant.

Figure 9:
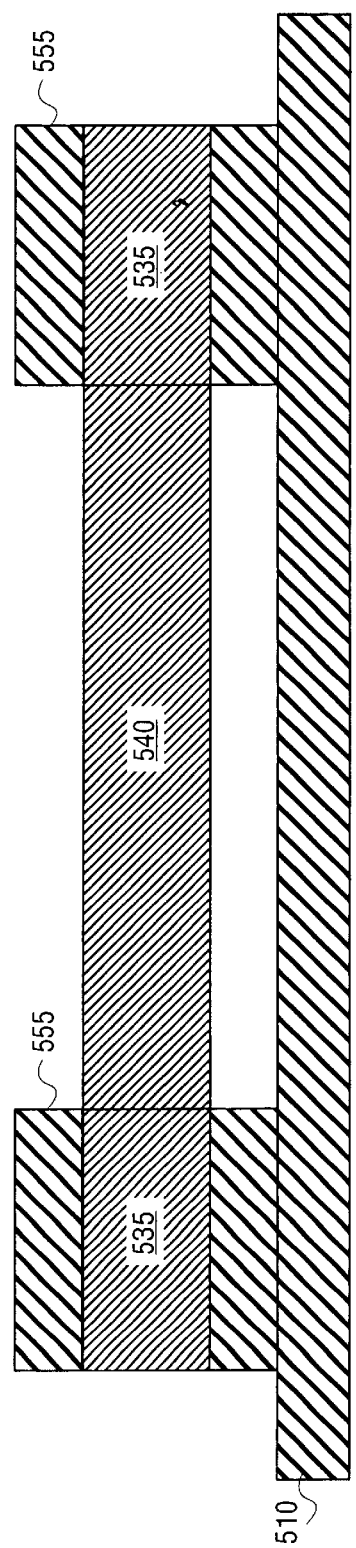
FIG. 9 shows a schematic, cross-sectional side view of a fourth embodiment of a modified MEMS-fabricated resonator.

FIG. 9 shows a fourth embodiment of a micro-bridge resonator structure modified to meet a targeted resonance frequency. In this example, structural material is added to the support structures to, for example, increase the target resonance frequency. Micro-bridge resonator structure 500 includes support structures 535 supporting resonator beam 540 over a portion of substrate 510. It has been found that it is possible to modify the frequency of vibration by adding material to support structures 535. For example, where it is found that the resonance frequency of an on-chip resonator is too low, the resonance frequency may be increased by adding material 555 to support structures 535. It is believed the addition of material 555 to support structures 535 stiffens micro-bridge resonator structure 500 thereby increasing the resonance frequency.

In the embodiment shown in FIG. 9, material 555 is introduced over support structures 535. Suitable material includes but is not limited to materials having a generally high modulus of elasticity. Materials having a modulus of elasticity of 100 giga-Pascals (gPa) and preferably greater than 100 gPa are particularly suitable. Such materials include, but are not limited to, silicon nitride (SiN) or tungsten (W).

In the illustration shown in FIG. 9, a free-standing structure is shown for over substrate 510. In general, a conventional deposition such as a chemical vapor deposition cannot be used to introduce material 555 over support structure 535 due to the possibility that the deposition will hinder or modify the free-standing structure to a non-free-standing form. Thus, in one embodiment, a point deposition technique is used to introduce material 555. Such point deposition techniques include laser or focused ion beam deposition techniques.

In the preceding detailed description, a technique to modify the resonance frequency of a structure (such as a resonator) is described as is structures (resonators) having modified or tuned resonance properties. Specific embodiments thereof. It will, however, be evident that various modifications and changes may be made thereto without departing from the broader spirit and scope of the claims. The specification and drawings are, accordingly, to be regarded in an illustrative rather than a restrictive sense.

What is claimed is:

1. A method comprising:

modifying a resonating frequency of a resonator coupled to at least one support structure on a chip-level substrate by modifying at least one support structure, wherein the at least one support structure comprises a body including a base coupled to the substrate and a top surface opposite the base, and modifying the at least one support structure comprises forming a notch in the top surface.

2. The method of claim 1, wherein forming the notch comprises forming the notch through less than the entire body of the at least one support structure.

3. The method of claim 1, further comprising coupling a first end of said resonator to a first support structure and coupling a second end of said resonator to a second support structure.

4. The method of claim 1, wherein forming a notch comprises forming a first notch in a first direction and a second notch in a second direction.

5. A method comprising:

forming a resonator coupled to at least one support structure on a chip-level substrate, the resonator having a resonating frequency; and modifying the resonating frequency of the resonator by modifying the at least one support structure, wherein the at least one support structure comprises a body including a base coupled to the substrate and a top surface opposite the base, and modifying the at least one support structure comprises forming a notch in the top surface.

6. The method of claim 5, wherein forming a notch comprises forming a first notch in a first direction and a second notch in a second direction.

7. The method of claim 5, wherein forming the notch comprises forming the notch through less than the entire body of the at least one support structure.

8. The method of claim 5, wherein forming a resonator comprises coupling a first end of said resonator to a first support structure and coupling a second end of said resonator to a second support structure.

9. An apparatus comprising:

a resonator coupled to at least one support structure on a chip-level substrate, the resonator having a resonating frequency tuned by the modification of the at least one support structure to a selected frequency stimulus, wherein the at least one support structure comprises a body, with a base of the body coupled to the substrate and at least one notch formed in a portion of the body.

10. The apparatus of claim 9, wherein the resonator is coupled at a first end to a first support structure and at a second end to a second support structure.

11. The apparatus of claim 9, wherein the at least one notch extends through less than the entire portion of the body.

12. The apparatus of claim 9, wherein the at least one support structure comprises a first notch in a first direction and a second notch in a second direction.

13. A method comprising:

applying a frequency stimulus to a resonator coupled to at least one support structure on a chip-level substrate;

determining a resonating frequency; and modifying the resonating frequency of the resonator by modifying the at least one support structure, wherein the at least one support structure comprises a body including a base coupled to the substrate and a top surface opposite the base, and modifying the at least one support structure comprises forming a notch in the top surface.

14. The method of claim 13, further comprising coupling a first end of said resonator to a first support structure and coupling a second end of said resonator to a second support structure.

15. The method of claim 13, wherein forming a notch comprises forming a first notch in a first direction and a second notch in a second direction.

16. The method of claim 13, wherein forming the notch comprises forming the notch through less than the entire body of the at least one support structure.

* * * * *